United States Patent [19]

Yamazaki et al.

[11] Patent Number: 6,087,245
[45] Date of Patent: Jul. 11, 2000

[54] METHOD OF GETTERING CRYSTALLIZATION CATALYST FOR FORMING A SILICON FILM

[75] Inventors: Shunpei Yamazaki, Tokyo; Hisashi Ohtani, Kanagawa, both of Japan

[73] Assignee: Semiconductor Energy Laboratory Co., Ltd., Japan

[21] Appl. No.: 09/021,770

[22] Filed: Feb. 11, 1998

[30] Foreign Application Priority Data

Feb. 12, 1997 [JP] Japan ................................... 9-044574

[51] Int. Cl.⁷ ...................................................... H01L 21/20
[52] U.S. Cl. .......................... 438/486; 438/473; 438/488; 257/DIG. 913
[58] Field of Search ..................... 438/166, 486, 438/488, 799, 143, 310, 473; 257/64, 65, 66, DIG. 913

[56] References Cited

U.S. PATENT DOCUMENTS

| 5,543,352 | 8/1996 | Ohtani et al. . | |
|---|---|---|---|
| 5,585,291 | 12/1996 | Ohtani et al. . | |
| 5,700,333 | 12/1997 | Yamazaki et al. | 136/258 |
| 5,814,835 | 11/1995 | Makita et al. . | |
| 5,837,569 | 4/1995 | Makita et al. . | |
| 5,851,860 | 6/1995 | Makita et al. . | |
| 5,854,096 | 6/1995 | Ohtani et al. . | |
| 5,893,730 | 2/1997 | Yamazaki et al. . | |
| 5,897,347 | 9/1996 | Yamazaki et al. . | |
| 5,904,770 | 1/1995 | Ohtnai et al. . | |
| 5,915,174 | 6/1999 | Yamazaki et al. | 438/166 |
| 5,923,962 | 10/1994 | Ohtani et al. . | |
| 5,961,743 | 10/1999 | Yamazaki et al. | 136/258 |

OTHER PUBLICATIONS

O'mara et al, Handbook of Semiconductor Silicon Technology, p 421, 1990.
Bird et al. Transport Phenomena, p 432, 1960.
G. H. Geiger andn D. R. Poirier, Transport Phenomena in Metallurgy, p367,368, 1973.
Julian Szekely and Nickolas J. Themelis, Process Metallurgy, p265, 1971.

*Primary Examiner*—Chandra Chaudhari
*Assistant Examiner*—Evan Pert
*Attorney, Agent, or Firm*—Fish & Richardson P.C.

[57] ABSTRACT

A mask including a material, which has heat resistance and light absorptivity, is selectively formed on a crystalline silicon film containing a catalytic element. Next, by using the mask, phosphorus is implanted into the silicon film and an implanted portion of the silicon film is transformed into amorphous. Then the silicon film is heated by a rapid thermal annealing (RTA) method, so that the temperature of the portion covered with the mask becomes higher than other portions. As a result, the catalytic element moves from the high temperature portion covered with the mask to the lower temperature amorphous portion in which phosphorus has been implanted and which has a large gettering capacity. Thus, the concentration of the catalytic element in the portion covered with the mask is lowered, and a semiconductor device is manufactured by using the film.

40 Claims, 8 Drawing Sheets

METHOD OF GETTERING CRYSTALLIZATION CATALYST FOR FORMING A SILICON FILM

BACKGROUND OF THE INVENTION

1. Field of the Invention

The present invention relates to a method of manufacturing a silicon film having crystallinity or a film having crystallinity and containing silicon. The present invention disclosed in the present specification can be used, for example, in manufacturing a thin film transistor (called a TFT).

2. Description of the Related Art

A thin film transistor (hereinafter referred to a TFT, etc.) using a thin film semiconductor is known. This is constituted by forming a thin film semiconductor, especially, a silicon semiconductor film on a substrate, and using this thin film semiconductor. The TFT is used for various kinds of integrated circuit, and especially has attracted attention as a switching element provided for each pixel of an active matrix type liquid crystal display device, or as a driver element formed in a peripheral circuit portion. Moreover, the TFT has also attracted attention as an indispensable art for a multilayer structure integrated circuit (solid IC).

It is simple to use an amorphous silicon film as a silicon film used for the TFT. However, there is a problem that the electrical characteristics thereof is far lower than those of a single crystal semiconductor used for a semiconductor integrated circuit. Thus, the amorphous silicon film has been employed for only limited uses such as a switching element of an active matrix circuit. The characteristics of the TFT can be improved by using a silicon thin film having crystallinity.

A silicon film having crystallinity other than single crystal silicon is referred to as polycrystalline silicon, polysilicon, microcrystalline silicon, or the like. Such a silicon film having crystallinity can be obtained by first forming an amorphous silicon film, and then crystallizing the amorphous silicon film through heating (thermal annealing). This method is referred to as a solid phase growth method since the amorphous state is transformed into the crystalline state while the film maintains the solid state.

However, in the solid phase growth of silicon, heat temperature of 600° C. or more, and time of 10 hours or more are required, so that there is a problem that it is difficult to use an inexpensive glass substrate as a substrate. For example, corning glass 7059 has a glass distortion point of 593° C., so that there is a problem in carrying out thermal annealing at a temperature not lower than 600° C. when consideration is given to enlarging an area of the substrate.

As to such a problem, according to the study by the present inventors, it has been proved that when a small amount of metal element of some kind, such as nickel and palladium, is deposited on the surface of an amorphous silicon film, and then heating is carried out, crystallization can be made under such conditions that a temperature is 550° C. and a processing time is about 4 hours. Of course, when annealing is carried out at a temperature of 600° C. for about 4 hours, a silicon film having more excellent crystallinity can be obtained (Japanese Patent Unexamined Publication No. Hei 6-244103).

The above-mentioned small amount of element (metal element for promoting crystallization) may be introduced by a method of depositing a coating film of the metal element or a compound thereof by a sputtering method (Japanese Patent Unexamined Publication No. Hei 6-244104), by a method of forming a coating film of the metal element or a compound thereof through a means such as a spin coating (Japanese Patent Unexamined Publication No. Hei 7-130652), by a method of forming a coating film by decomposing a gas containing the metal element through a means such as pyrolysis and plasma decomposition (Japanese Patent Unexamined Publication No. Hei 7-335548), or the like. Those methods may be changed according to the respective features.

Moreover, it is also possible to selectively adding the metal element into a specific portion and then to extend the crystal growth from the portion where the metal element has been added to the surrounding by heating (lateral growth method or side growth method). Since the crystalline silicon obtained by such a method has directionality in crystallization, the silicon shows extremely excellent properties in accordance with the directionality.

It is also effective to further improve the crystallinity by irradiation of intense light such as a laser beam after the crystallization step using the metal element (Japanese Patent Unexamined Publication No. Hei 7-307286). In the above-mentioned lateral growth method, it is also effective to carry out thermal oxidation subsequent to the lateral growth (Japanese Patent Unexamined Publication No. Hei 7-66425).

When crystallization was carried out using the metal element as described above, a more excellent crystalline silicon film was obtained under conditions of lower temperature and shorter time. Although temperature at heat treatment greatly depends on the kind of the amorphous silicon film, the temperature of 450 to 650° C., especially 550 to 600° C. was preferable.

However, the most serious problem of this method is the removal of the metal element. It can not be neglected for the metal element added into the silicon film to give bad influence to electrical characteristics and reliability. Especially, in the step of crystallization using the metal element, in the mechanism, since the metal element as mainly conductive silicide remains in a coating film, the metal element becomes a terrible cause for defects.

It is generally known that a metal element (especially, nickel, palladium, platinum, copper, silver, and gold) can be captured by a crystal defect, phosphorus, etc. For example, Japanese Patent Unexamined Publication No. Hei 8-330602 discloses a technique in which a phosphorus ion is implanted into a silicon film using a gate electrode as a mask, then the metal element contained in the silicon film is moved to a source and a drain region by carrying out thermal annealing (furnace annealing) or light annealing (laser annealing, etc.), and then the metal element is fixed (gettered) to reduce the concentration of the metal element in a channel formation region.

In Japanese Patent Unexamined Publication No. Hei 8-330602, when phosphorus is implanted into the source and drain regions, since a silicon film is made amorphous and crystal defects increase, the metal element can be gettered by phosphorus and the crystal defects. Here, phosphorus can be implanted not only into the source and drain regions but also into any portion as long as the portion is not a place where a channel formation region is to be provided. It is obvious for a skilled person that the metal element can be removed by the above method although the degree of removal is different according to the distance from the portion where phosphorus has been implanted.

In order to carry out gettering, it is necessary to carry out annealing for a sufficient time so that the metal element can move to a region where phosphorus has been implanted. Thus, thermal annealing is preferable for the purpose. However, annealing temperature effective for the gettering (although the temperature depends on the kind of the metal element) is generally more than 600° C. When a process at such high temperature is carried out for a long time, the possibility of deforming a substrate is raised to cause the slippage of a mask (the misalignment of a mask) in a subsequent step of photolithography.

Thus, although the light annealing is preferable, Japanese Patent Unexamined Publication No. Hei 8-330602 does not particularly discuss a light source for the light annealing, and merely states that an excimer laser is used in an example. However, a pulse width of the excimer laser is not larger than 100 ns, and it is experimentally proved that gettering can not be sufficiently carried out by light irradiation for such a short time.

Japanese Patent Unexamined Publication No. Hei 8-330602 discloses that the substrate is irradiated with a laser beam from a place above the substrate. However, in any examples, since aluminum having high optical reflectivity is used and the thickness thereof is not less than 3,000 Å, it is difficult to give a sufficient amount of heat to a channel formation region so that the metal element is moved.

SUMMARY OF THE INVENTION

The present invention has been made in view of the above described problems, and an object thereof is to provide conditions suitable for light annealing to thereby provide a method effective to remove a catalytic element.

The basic concept of the present invention is to heat a region where a metal element is to be removed, by light annealing, for a sufficient time and to a sufficient temperature. With respect to the heating for the sufficient time, a well-known rapid thermal annealing (RTA) method is preferable.

When the RTA is used, high gettering efficiency can be obtained by heating for one second to ten minutes, though the time also depends on temperature. Further, according to this method, only a specific material can be heated without directly heating a substrate.

Further, this heating step has not only the gettering function but also an effect of improving the crystallinity.

A crystalline silicon film obtained by using a metal element for promoting crystallization of silicon is in a polycrystalline state. When the RTA is carried out, the number of dangling bonds existing in grain boundaries is lessened and the grain boundaries are inactivated. This is effective in improving the characteristics of a device element in the case where a device is formed. That is, rearrangement of silicon atoms existing in the vicinity of the crystal grain boundaries is promoted, so that combination among silicon atoms in the crystal grain boundaries is promoted. As a result, the inactivation of the crystal grain boundaries is progressed.

According to the method of Japanese Patent Unexamined Publication No. Hei 8-330602, as described before, although a region where phosphorus has been implanted is sufficiently heated by light annealing (laser annealing), an important region where a catalytic element is to be removed, is not sufficiently heated. However, even if a gate electrode, which blocks out the light, is removed for the purpose of solving the problem, an essential solution can not be obtained.

The reason is as follows. That is, since a region where phosphorus has been implanted is amorphous, the region has light absorptivity higher than a crystalline region where the metal element is to be removed, the temperature of the portion where phosphorus has been implanted is higher than the temperature of the portion where the metal element is to be removed, and the amount of the metal element moving from the former portion to the latter portion can not be neglected as compared with the amount of the metal element moving from the latter portion to the former portion, so that the efficiency of gettering is lowered.

Of course, since the former portion includes a large amount of phosphorus and defects for capturing the metal element, most of the metal elements are fixed to those. However, some of the metal elements can move and the ratio is increased as the temperature is raised.

That is, if the temperature of the region where phosphorus has been implanted, is not lower than the temperature of the region where the metal element is to be removed, a sufficient effect can not be obtained.

In the present invention disclosed in the present specification, an energy is effectively absorbed in a mask material in the step of carrying out the RTA so that a region where gettering is to be carried out (that is, a semiconductor region covered by the mask), is selectively heated to a high temperature.

By intentionally making such a state, the movement of the metal element in the region where the metal element is to be removed, becomes active due to the high temperature, so that more metal elements flow into the region a temperature of which is lower and in which the phosphorus has been implanted, and are fixed.

At this time, since the region where phosphorus has been implanted, has a lower temperature, the movement of the metal element is suppressed and the metal element is gettered more effectively.

In order to realize the above concept, according to the present invention, a method of manufacturing a semiconductor device comprises the steps of selectively masking a part of a crystalline silicon film or a crystalline film containing silicon, which has been obtained by using a metal element for promoting crystallization of silicon; accelerating and implanting an element in group 15 into a region which has not been masked in the masking step; and radiating intense light to heat a masked region of the film at a temperature higher than other portions to move the metal element from the masked region of the film to the other portions, and is characterized in that a material used in the masking step has a property to absorb the intense light at absorptivity higher than the crystalline silicon film or the crystalline film containing silicon.

Further, according to another aspect of the present invention, a method of manufacturing a semiconductor device comprises the steps of selectively masking a part of a crystalline silicon film or a crystalline film containing silicon, which has been obtained by using a metal element for promoting crystallization of silicon; accelerating and implanting an element in group 15 into a region which has not been masked in the masking step; and radiating intense light to heat a masked region of the film at a temperature higher than other portions, and is characterized in that a material used in the masking step has a property to absorb the intense light at absorptivity higher than the crystalline silicon film or the crystalline film containing silicon.

Further, the present invention has the following steps:
(1) a step of crystallizing an amorphous silicon film by using a metal element;
(2) selectively forming a mask including a material, which has light absorptivity to light to be radiated in subsequent step (4) and has heat resistance, on a crystalline silicon film obtained in step (1);

(3) implanting phosphorus into the silicon film by using the mask; and (4) carrying out an RTA process to the silicon film and the mask.

On the other hand, phosphorus may be selectively implanted by using a mask formed when the metal element is selectively introduced. This is another invention disclosed in the present specification, and has the following steps.

(1) selectively forming a mask including a material, which has light absorptivity to light to be radiated in subsequent step (5) and has heat resistance, on an amorphous silicon film;

(2) selectively introducing a metal element into the amorphous silicon film by using the mask, or forming a coating film including the metal element;

(3) heating the amorphous silicon film to crystallize the film;

(4) implanting phosphorus into the silicon film by using the mask; and (5) carrying out an RTA process to the silicon film and the mask.

The important feature of the present invention disclosed in the present specification is the selection of the material of the mask. The thickness of the material is also important.

It is preferable to use tungsten, chromium, molybdenum, or titanium, which is superior in absorption of near infrared rays and visible rays, as the material. Since it is not preferable that these materials are brought into direct contact with the silicon film, it is preferable to provide a coating film having excellent barrier properties (for example, silicon nitride) between the material and the silicon film. Especially, in the above-mentioned another invention, since the step of thermal annealing for crystallization exists after the formation of the mask, a sufficient countermeasure is required so that the material of the mask is not dispersed into the silicon film at the thermal annealing step.

It is preferable that the thickness of the mask is not less than 1,000 Å. If the thickness is too thin, the light absorptivity is insufficient. When the radiation of light is carried out from a place above the substrate in the RTA step, if the thickness of the mask is too thick, heat conduction is insufficient. Thus, it is preferable that the thickness is not larger than 5,000 Å. Similarly, if the barrier film provided between the mask and the silicon film is too thick, the heat conductivity is not excellent. Thus, it is preferable that the thickness of the barrier film is not larger than 2,000 Å. A thin (10 to 100 Å) film of silicon oxide or the like may be provided between the barrier film and the silicon film for the purpose of increasing adhesiveness.

On the other hand, when the RTA is carried out by radiating the light from a place under the substrate (rear side), the thickness of the mask is not problematic as long as the mask sufficiently absorbs light, so that the thickness up to 1 μm is possible. However, if the thickness is too thick, since absorbed heat is used for heating of the mask rather than heating of the silicon film, it is not preferable. Also in this case, the same is true of the thickness of the barrier film.

In the present invention, the temperature of the portion where the metal element is to be removed, is made 600 to 1,200° C., preferably 700 to 1,000° C. Since the portion absorbing light is concentrically heated in the RTA method, the temperature of the substrate itself is far lower than the above temperature. Thus, it is possible to neglect the influence by the RTA method to the substrate.

A kind or plural kinds of element selected from the group consisting of Fe, Co, Ni, Ru, Rh, Pd, Os, Ir, Pt, Cu, and Au may be used as the metal element. Especially, using Ni is most preferable in the reproducibility and effects.

Using phosphorus as the element in group 15 used for gettering is preferable. Especially, the combination of nickel and phosphorus is most preferable.

Phosphorus and nickel includes a number of combined states such as $Ni_3P$, $Ni_5P_2$, $Ni_2P$, $Ni_3P_2$, $Ni_2P_3$, $NiP_2$, and $NiP_3$.

Thus, in the case where nickel is adopted as the metal element for promoting crystallization and phosphorus is adopted for the element in group 15, it is possible to effectively capture the nickel as a combination with phosphorus. That is, gettering can be effectively carried out.

Other than phosphorus, the element in group 15 such as N, As, Sb, and Bi may be used.

In the gettering, a grain boundary in the silicon film becomes an obstacle to the movement of the metal element. In general, in the silicon film after solid phase growth, the metal element as silicide precipitates in the grain boundary, and as a result, the grain boundary grows. Since such silicide is thermodynamically stable (after all, the metal element precipitates in the grain boundary since the state is thermodynamically stable), the metal element is hard to move from this portion. Further, there is caused a problem to capture the metal element moved from other portion and fix the metal element.

On the other hand, when a laser annealing process is carried out by irradiating the silicon film, which has been crystallized in the solid phase growth, with pulse laser beams, a tendency for the metal element to precipitate in the grain boundary, is greatly decreased. This is because a processing time by the pulse laser annealing (especially with a pulse width of not larger than 1 μsec) is too short to make a thermodynamically stable state. The growth of grain boundary is also insufficient. That is, in the silicon film after the pulse laser annealing, many metal elements exist in such a manner that the elements are dispersed in the silicon film. Thus, these metal elements are extremely apt to move, and there are also few large grain boundaries to capture the metal elements, so that gettering can be effectively carried out.

It is preferable to make the concentration of phosphorus higher than the concentration of the metal element by one figure or more. The concentration is preferably made a high concentration such as $5\times10^{19}$ to $2\times10^{21}$ atoms/cm$^3$. When phosphorus is implanted, hydrogen, oxygen, nitrogen, or carbon with a concentration of $1\times10^{19}$ to $1\times10^{21}$ atoms/cm$^3$ may be implanted at the same time. When a large number of these elements exist, crystallization at the RTA is hindered, so that the quantity of defects in the portion where phosphorus has been implanted, can be maintained. When the concentration of carbon, nitrogen, or oxygen is high, the transparency of the silicon film is raised, so that it is possible to lower the light absorption by the portion where phosphorus has been implanted, and to suppress heating of the portion.

The present invention is different from Japanese Patent Unexamined Publication No. Hei 8-330602 in that gettering is carried out in the step of defining an active layer of a transistor by etching of a silicon film. However, although a portion of a region where phosphorus has been implanted for the purpose of gettering, may be completely removed, the region can also be used as a part or the entire of source and drain regions of a transistor. If the region is planned to be used as a part or the entire of the source and drain regions of a P-channel transistor, it is sufficient to implant a p-type impurity (boron, antimony, arsenic, etc.) with a concentration exceeding the above-mentioned amount of implanted phosphorus. An example in which the region is used as the entire of the source and drain regions of the P-channel transistor, is disclosed in Japanese Patent Unexamined Publication No. Hei 8-330602.

DETAILED DESCRIPTION OF THE INVENTION

Embodiment 1

In this embodiment, an example in which a silicon film having crystallinity is formed on a glass substrate, will be described. Steps from introduction of a metal element (nickel is used in this embodiment), via crystallization and gettering of the metal element, to defining of an active layer will be described with reference to FIGS. 1A to 1F.

Figure 1A:
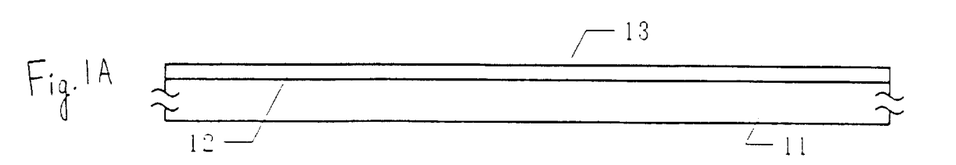
FIGS. 1A to 1F are views showing manufacturing steps in embodiment 1.

First, an amorphous silicon film 12 is formed by plasma CVD or low pressure CVD on a substrate 11 on which a silicon oxide film (not shown) is formed by a sputtering or a plasma CVD method with a thickness of 1,000 to 5,000 Å, for example, 2,000 Å. In this embodiment, the amorphous silicon film 12 with a thickness of 500 Å was formed by the plasma CVD method. Then hydrofluoric acid treatment was carried out to remove a stain and a natural oxidation film.

An amorphous semiconductor film of a silicon compound, for example, a compound semiconductor as is expressed by $Si_xGe_{1-x}$ may be used other than the amorphous silicon film.

Next, an extremely thin film of nickel was formed. In this embodiment, a spin coating method was adopted. The detailed conditions are disclosed in embodiment 1 of Japanese Patent Unexamined Publication No. Hei 7-130652. That is, a silicon oxide film (not shown) with a thickness of 10 to 50 Å was obtained by radiation of ultraviolet rays (low pressure mercury lamp) in an oxygen atmosphere for five minutes.

Then a nickel acetate solution, in which the concentration of nickel was 100 ppm, of 2 ml was dropped onto the substrate, this state was maintained, and spin drying (2,000 rpm, 60 seconds) was carried out by using a spinner. In this way, an extremely thin film 13 of nickel acetate was formed. Since the nickel acetate thin film is extremely thin, there is a possibility that the film is not a continuous film. However, there is no problem in a result (FIG. 1A).

Figure 1B:
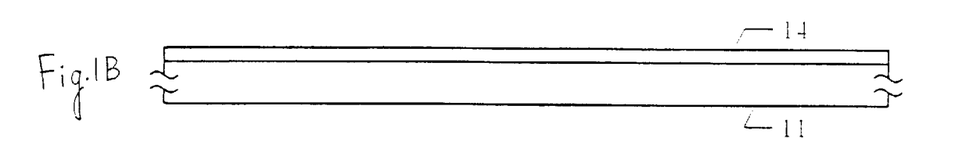

Thereafter, a step of solid phase growth (crystallization) was carried out. That is, the substrate was set so that the substrate was heated to a temperature of 550 to 600° C., for example 600° C. in a nitrogen atmosphere, and was left in this state. Nickel acetate was thermally decomposed at about 300° C. to become nickel, and further functioned as a catalysis at a temperature of 450° C. or more, so that crystallization of the amorphous silicon film was progressed. A crystallized silicon film 14 was obtained by leaving the substrate for a necessary time, for example, 4 hours (FIG. 1B).

Figure 1C:
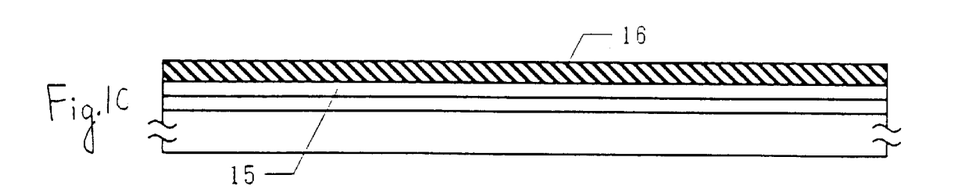

Next, the previously formed silicon oxide film on the surface was removed by the hydrofluoric acid treatment. Then a silicon nitride film 15 (with a thickness of 1,000 Å) and a tungsten film 16 (with a thickness of 2,500 Å) were formed on the silicon film respectively by the plasma CVD method and the sputtering method. Since the stress of the silicon nitride film is extremely strong according to the composition, the film is apt to be peeled off. In order to solve the problem, it is preferable to change the composition (especially the concentration of hydrogen) or to form a silicon oxide film with a thickness of 10 to 100 Å between the silicon film 14 and the silicon nitride film 15 (FIG. 1C).

Figure 1D:
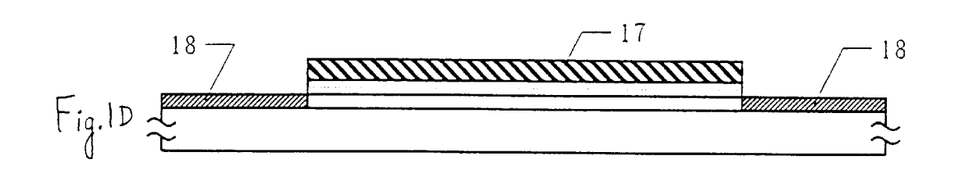

Thereafter, the tungsten film 16 and the silicon nitride film 15 were etched to form a mask 17. Next, by using this mask 17, a phosphorus ion was implanted into a region which had not been covered with the mask. An ion doping method (plasma doping method) was used for this step. In this method, a high voltage is applied to an ionized doping gas (in this embodiment, phosphine ($PH_3$) diluted with hydrogen) of a low pressure (about $10^{-5}$ Torr) to accelerate. An acceleration voltage is made 5 to 25 kV, and a dosage is made $1 \times 10^{13}$ to $8 \times 10^{15}$ atoms/cm$^2$, for example, $5 \times 10^{14}$ atoms/cm$^2$. If it is presumed that phosphorus is uniformly distributed in the silicon film, the concentration thereof becomes $1 \times 10^{20}$ atoms/cm$^3$. In this way, a region where phosphorus had been implanted was obtained (FIG. 1D).

Figure 1E:
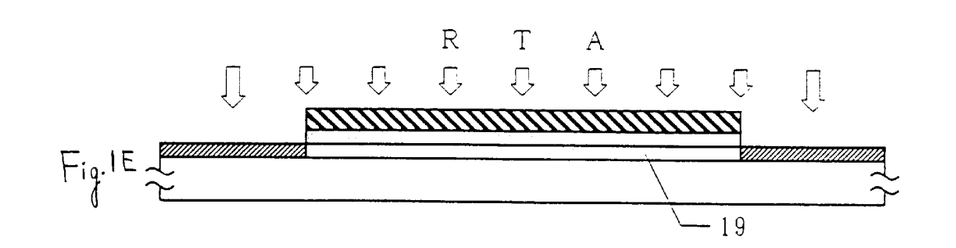

Thereafter, the silicon film 14 and the mask 17 were heated by the RTA method. In this embodiment, the maximum temperature was made 800° C. and the heating time was made one minute. Light was radiated from a place above the substrate. By this step, a metal element which had existed in a silicon film region 19 (this region was intrinsic) under the mask was gettered to the region 18 where phosphorus had been implanted (FIG. 1E).

Figure 1F:
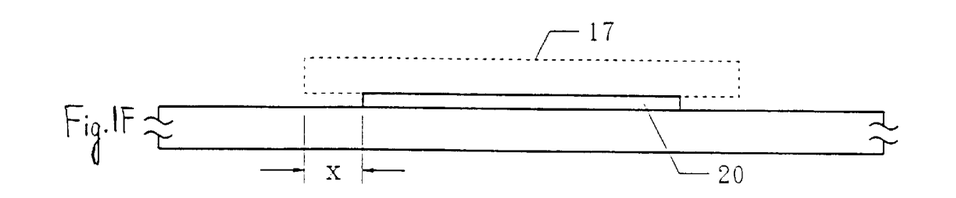

Next, the mask 17 (including the silicon nitride film) was removed, and further a part (including the region 18 where phosphorus had been implanted) of the silicon film 14 was etched to form an active layer 20 of a transistor. At this time, etching was also applied to a portion separate by a distance X from the region 18 where phosphorus had been implanted. This was done to prevent diffusion of phosphorus in the RTP step or the like from influencing the active layer (FIG. 1F).

By the above step, an active layer 20 which was crystallized and in which a concentration of nickel was lowered, was obtained.

Embodiment 2

This embodiment is an example in which in the manufacturing steps shown in embodiment 1, before a coating film of a metal element is formed, a mask of a silicon nitride film is provided, nickel is selectively introduced by using the silicon nitride film as a mask, solid phase growth is carried out to make crystallization in a lateral direction, and phosphorus is implanted to remove nickel. FIGS. 2A to 2G schematically show manufacturing steps of this embodiment.

Figure 2A:
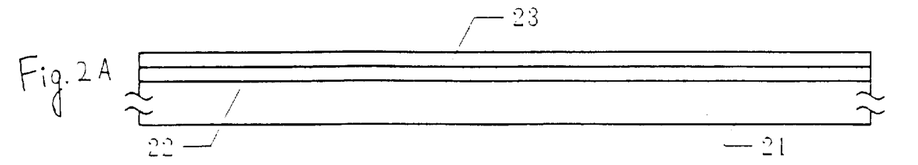
FIGS. 2A to 2G are views showing manufacturing steps in embodiment 2.

First, an amorphous silicon film 22 with a thickness of 500 to 1,000 Å was formed by a plasma CVD method or a low pressure CVD method on a glass substrate 21 on which a silicon oxide film (not shown) with a thickness of 1,000 to 5,000 Å was formed.

Further, a silicon nitride film 23 with a thickness of 1,000 Å or more, in this embodiment, 1,200 Å, which became a mask film, was formed by the plasma CVD method. It was confirmed through experiments by the present inventors that there was no problem even if the thickness of the silicon nitride film 24 was 500 Å. However, in order to prevent nickel from being introduced into unexpected portions by the existence of pin holes or the like, the film in this embodiment was made to have an enough thickness. Incidentally, for the purpose of relieving the stress of the silicon nitride film, a silicon oxide film may be disposed under the silicon nitride film (FIG. 2A).

Figure 2B:
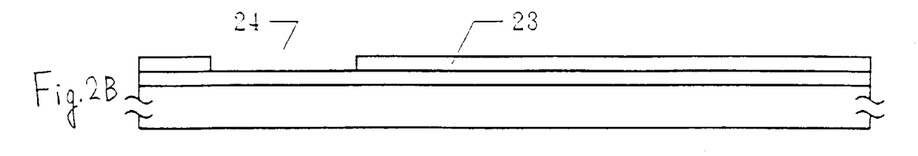

The silicon nitride film 23 was etched into a required pattern by a normal photolithography patterning step, so that a window 24 for introduction of nickel was formed (FIG. 2B).

Figure 2C:
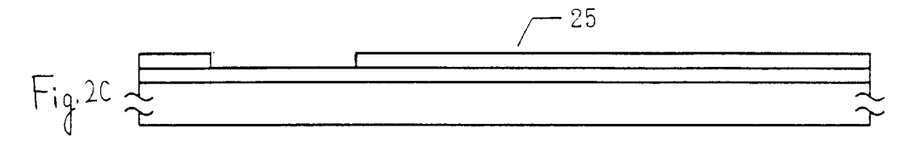

An extremely thin film 25 of nickel acetate with an objective thickness was deposited on the thus processed substrate by a spin coating method similarly to embodiment 1 (FIG. 2C).

Figure 2D:
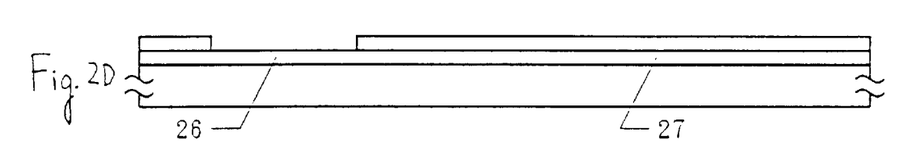

Subsequently, heat treatment at a temperature of 550° C. (in a nitrogen atmosphere) for 8 hours was carried out to crystallize the amorphous silicon film 22. At this time, crystallization began at a portion 26 where the nickel acetate was brought into close contact with the amorphous silicon film.

Thereafter, crystallization was progressed to the surrounding and crystallization was carried out even in the region 27 covered with the mask film 23 (FIG. 2D).

As shown in FIG. 2D, in the case where crystallization in the lateral direction is carried out as in this embodiment, if rough classification is made, three regions having different properties can be obtained. The first region is a region where the nickel film was brought into close contact with the amorphous silicon film, which is a region indicated by reference numeral 26 in FIG. 2D. This region is crystallized at the first stage of the thermal annealing step. This region is referred to as a vertical growth region. In this region, the concentration of nickel is relatively high, and the direction of crystallization is not uniform. As a result, the crystallinity of silicon is not very excellent, so that an etching rate to hydrofluoric acid and other acids is relatively high.

The second region is a region where crystallization in the lateral direction was carried out, which is indicated by reference numeral 27 in FIG. 2D. This region is referred to as a lateral growth region. In this region, the direction of crystallization is uniform, and the concentration of nickel is relatively low, so that the region is a preferable region when it is used for a device. The third region is an amorphous region to which crystallization in the lateral direction does not reach.

Figure 2E:
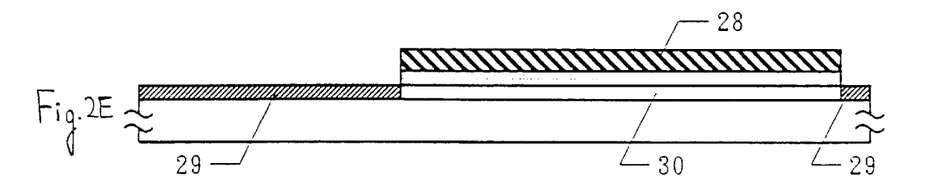

Next, a tungsten film (with a thickness of 2,500 Å) was formed by a sputtering method on the mask 23 of silicon nitride, and the tungsten film and the mask 23 of the silicon nitride were etched to form a mask 28. At this time, the mask 28 is formed in such a manner as to avoid the opening portion 24 for introduction of nickel. When etching of the mask 23 of the silicon nitride is carried out, and in the case where wet etching is adopted, there is a case where the silicon film 26 at the opening portion 24 is severely etched according to an etchant.

This is caused since the concentration of nickel in the portion is high. Although this is preferable in the sense of positively removing nickel from the silicon film, this has a problem that the influence also reaches an under film and the substrate. If the latter problem is not very serious, it is also possible to adopt the step of positively etching nickel (in this case, nickel exists mainly in the state of nickel silicide).

Next, by using this mask 28, a phosphorus ion was implanted by using an ion doping method into a region which was not covered with the mask. 5% of Phosphine ($PH_3$) diluted with hydrogen was used as a doping gas, an acceleration voltage was made 10 kV, and a dosage was made $8 \times 10^{14}$ atoms/cm$^2$. If it is presumed that phosphorus is uniformly distributed in the silicon film, the concentration thereof becomes $1 \times 10^{20}$ atoms/cm$^3$. In this way, a region 29 where phosphorus had been implanted, was obtained (FIG. 2E).

Figure 3A:
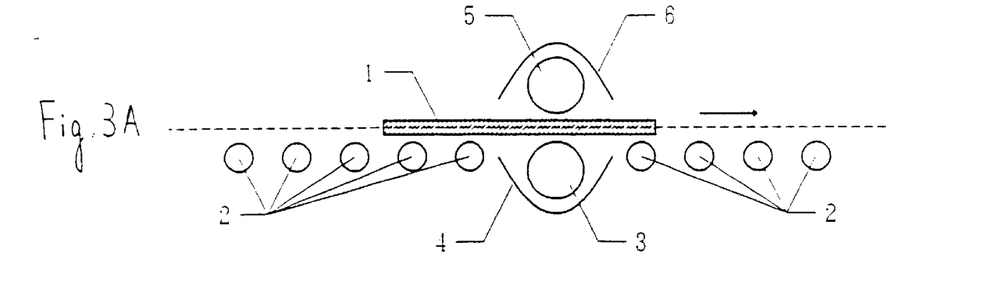
FIGS. 3A and 3B are views showing the outline and characteristics of an RTA apparatus used in embodiment 2.

Thereafter, the silicon film 27 and the mask 28 were heated by the RTA method. FIG. 3A shows the section of an apparatus which was used for the RTA. This apparatus has such a structure that linear main lamps 3 and 5 are disposed above and below a substrate 1, and the upper and lower faces of the substrate 1 are irradiated by concave mirrors 4 and 6. The substrate moves between the main lamps as shown by an arrow in the drawing. A plurality of linear lamps 2 for pre-heating are provided for the RTA apparatus (FIG. 3A).

Figure 3B:
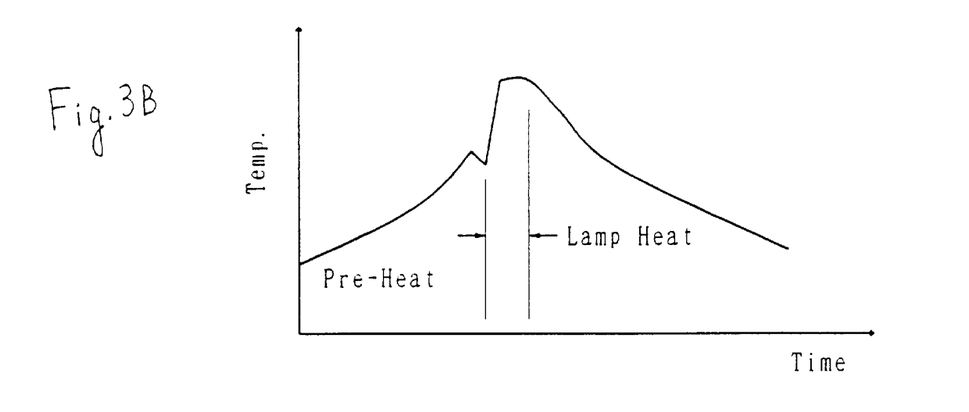

While the substrate moves from the left to the right, it is gradually heated by the pre-heating lamps 2 so that the temperature is raised. Thereafter, the substrate is heated by the main lamps so that the temperature is abruptly raised (Lamp-Heat). Thereafter, the temperature is gradually lowered. The power applied to the pre-heating lamps may be adjusted so that the temperature of a pre-heating lamp is made higher as the pre-heating lamp is positioned closer to the main lamps (FIG. 3B).

Figure 2F:
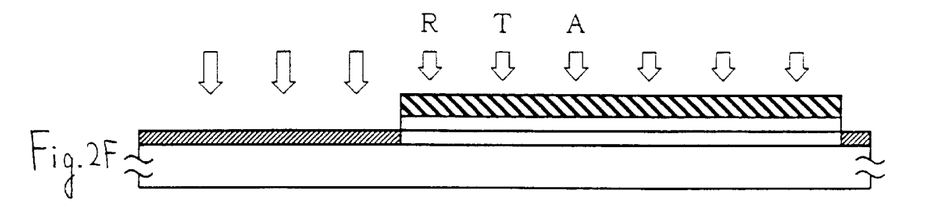

In this embodiment, the maximum temperature was made 700° C. and the heating time was made 10 minutes. The substrate was irradiated from two directions above and below the substrate. By this step, the metal element existing in the silicon film region 30 under the mask was gettered by the region 29 where phosphorus had been implanted (FIG. 2F).

Figure 2G:
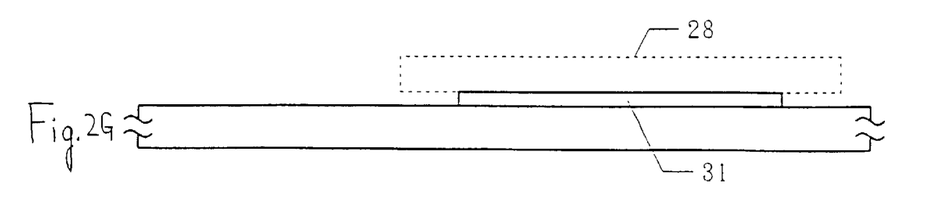

Next, the mask 28 (including the silicon nitride film) was removed and a part (including the region where phosphorus had been implanted) of the silicon film 27 was etched to form an active layer 31 of the transistor (FIG. 2G).

By the above step, the active layer 31 which was crystallized and in which the concentration of nickel was lowered, was obtained.

Embodiment 3

Figure 4A:
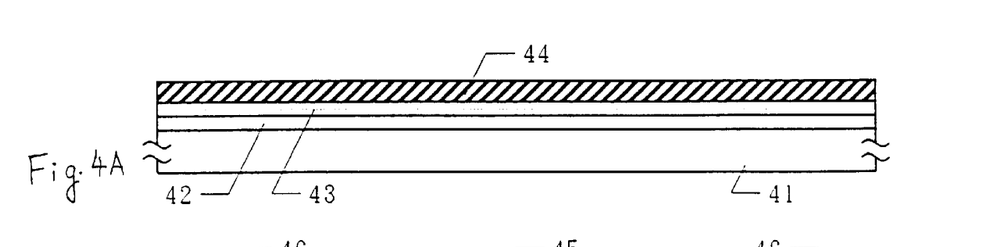
FIGS. 4A to 4C are views showing manufacturing steps in embodiment 3.
Figure 4B:
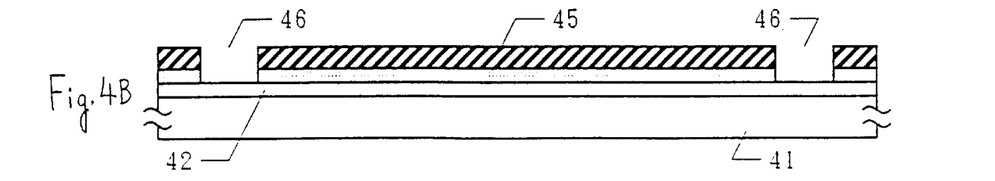
Figure 4C:
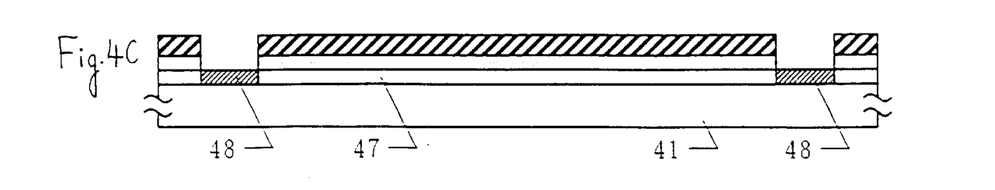

This embodiment is such that when the lateral growth as shown in embodiment 2 is carried out, the mask for selectively introducing a metal element is made the same as the mask for implanting phosphorus for gettering the metal element, so that manufacturing steps are simplified. FIGS. 4A to 4C schematically show the manufacturing steps in this embodiment.

First, an amorphous silicon film 42 with a thickness of 500 Å to 1,000 Å was formed by a plasma CVD method or a low pressure CVD method on a glass substrate (Corning 7059, 10 by 10 centimeters square) 41 on which a silicon oxide film (not shown) with a thickness of 1,000 to 5,000 Å was formed.

Further, a silicon nitride film 43 with a thickness of 1,000 Å or more, in this embodiment, 1,200 Å, which became a mask film, was formed by the plasma CVD method. Further, a tungsten film 44 with a thickness of 2,500 Å was formed by a sputtering method (FIG. 4A).

The silicon nitride film 43 and the tungsten film 44 were etched into a required pattern by a well-known photolithography patterning step, so that a mask 45 having a window 46 for introduction of nickel was formed. The mask 45 is also used for implantation of phosphorus in a subsequent step (FIG. 4B).

An extremely thin film 25 of nickel acetate with an objective thickness was deposited on the thus processed substrate by a spin coating method similarly to embodiment 1, and heat treatment at a temperature of 550° C. (in a nitrogen atmosphere) for 8 hours was carried out to crystallize the amorphous silicon film 42 to obtain a crystalline silicon film 47.

Next, using this mask 45, a phosphorus ion was implanted into a region which was not covered with the mask. The conditions of doping were the same as those in embodiment 2. In this way, a region where phosphorus had been implanted, was obtained. This region almost coincides with the vertical growth region (FIG. 4C).

Thereafter, similarly to other embodiments, the RTA treatment was carried out to getter nickel, so that a silicon film which was crystallized and in which the concentration of nickel was lowered, was obtained.

Embodiment 4

FIGS. 5A to 5E schematically show steps of manufacturing an N-channel thin film transistor (TFT) having a low concentration drain region by using a crystalline silicon film manufactured by the present invention. In this embodiment, a part of the region which has been provided for gettering and in which phosphorus has been implanted, is used to make source and drain regions, and a low concentration drain region is formed by self-alignment doping in which a gate electrode is used as a mask. By this way, it becomes unnecessary to provide another doping step of an N-type region of high concentration.

Figure 5A:
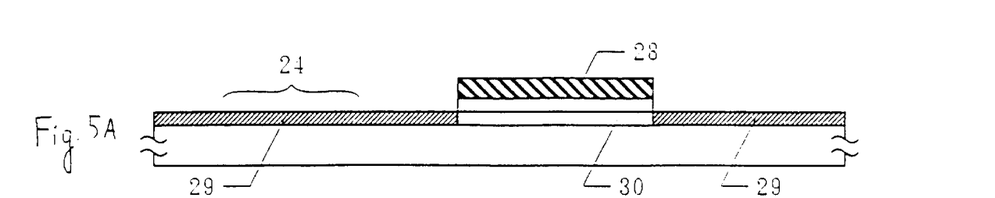
FIGS. 5A to 5E are views showing manufacturing steps of a TFT in embodiment 4.

The process is progressed to the state shown in FIG. 2E by the steps described in embodiment 2. This state is shown in FIG. 5A in which the same reference numerals as those in FIG. 2E are shown. That is, FIG. 5A shows a region 29 where phosphorus has been introduced, a mask 28 for implanting phosphorus, and a crystalline silicon film 30 under the mask. In this state, the RTA process has already been ended. A region 24 where nickel has been selectively introduced, exists in a part of the region where phosphorus has been implanted (FIG. 5A).

Figure 5B:
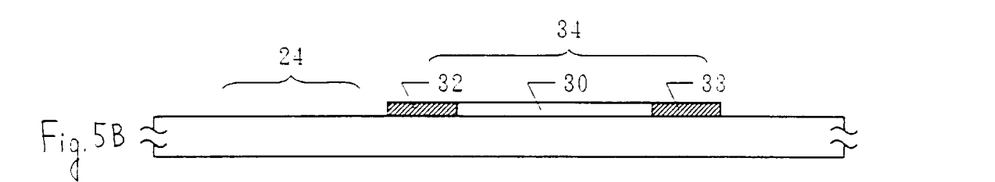

Next, the silicon film is etched to form an active layer 34. At that time, a part of the region where phosphorus has been implanted, is left, and is made into a source 32 and a drain 33 of the TFT. That is, the active layer 34 is constituted by the source 32, the drain 33, and the intrinsic region 30 put therebetween. However, since the portion 24 where nickel has been introduced, should not be used for the source and the drain, since the chemical properties of the silicon film is unstable in the portion 24 (FIG. 5B).

Figure 5C:
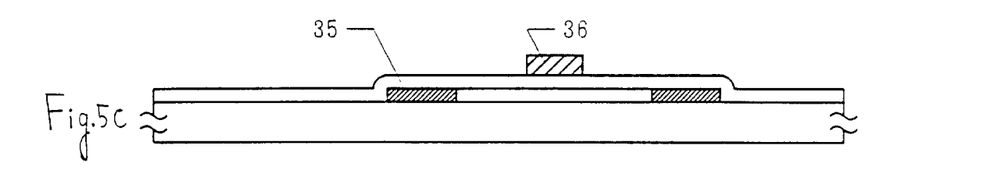

Thereafter, a silicon oxide film 35 with a thickness of 200 to 1,500 Å, in this embodiment, 1,000 Å was deposited by a plasma CVD method. This silicon oxide film functions as a gate insulating film. Next, a polycrystalline silicon film which had a thickness of 2,000 Å to 1 μm and had been doped with phosphorus, was formed by a low pressure CVD method, and this film was patterned to form a gate electrode 36 (FIG. 5C).

Various kinds of silicide material and aluminum may be used as a material of the gate electrode.

Figure 5D:
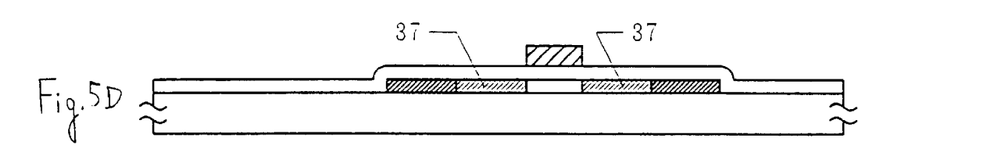

Thereafter, an impurity (phosphorus) was implanted, in a self-aligning manner, into the island-shaped silicon film of the TFT by using the gate electrode 36 as a mask. Phosphine (PH$_3$) was used as a doping gas. An acceleration voltage was made 50 to 80 kV since it was necessary to carry out doping through the gate insulating film. A dosage was made $1\times10^{13}$ to $4\times10^{14}$ atoms/cm$^2$, for example, $5\times10^{13}$ atoms/cm$^2$. In this way, an Ntype region 37 of a low concentration was formed. It is presumed that the concentration of phosphorus is $1\times10^{19}$ atoms/cm$^3$ (FIG. 5D).

Thereafter, a silicon oxide film with a thickness of 3,000 to 8,000 Å as an interlayer insulating film 38 was formed on the entire surface by a plasma CVD method of TEOS as a raw material and oxygen, or a low pressure CVD method or a normal pressure CVD method of TEOS and ozone. The temperature of the substrate was made 250 to 450° C., for example, 350° C. After formation of the film, in order to obtain the flatness of the surface, this silicon oxide film may be mechanically polished, or flattened by an etch back method.

Figure 5E:
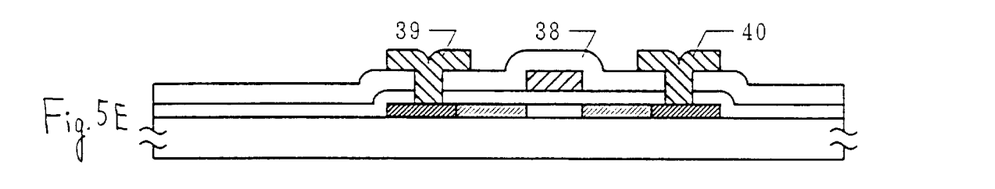

Then the interlayer insulating film 38 was etched to form contact holes to the source/drain regions of the TFT, and wiring/electrodes 39 and 40 of aluminum were formed.

Finally, annealing was carried out in hydrogen at a temperature of 300 to 400° C. for 0.1 to 2 hours, and hydrogenation of silicon was completed. In this way, the TFT was completed (FIG. 5E).

Although an example in which a top-gate type TFT is manufactured, is shown, the present invention disclosed in the present specification can also be used when a bottom-gate type TFT is manufactured.

Embodiment 5

In this embodiment, the outline of devices using TFTs manufactured by using the present invention disclosed in the present specification will be described. FIGS. 6A to 6F show the outline of the respective devices.

Figures 6A, 6B, 6C, 6D, 6E, 6F:
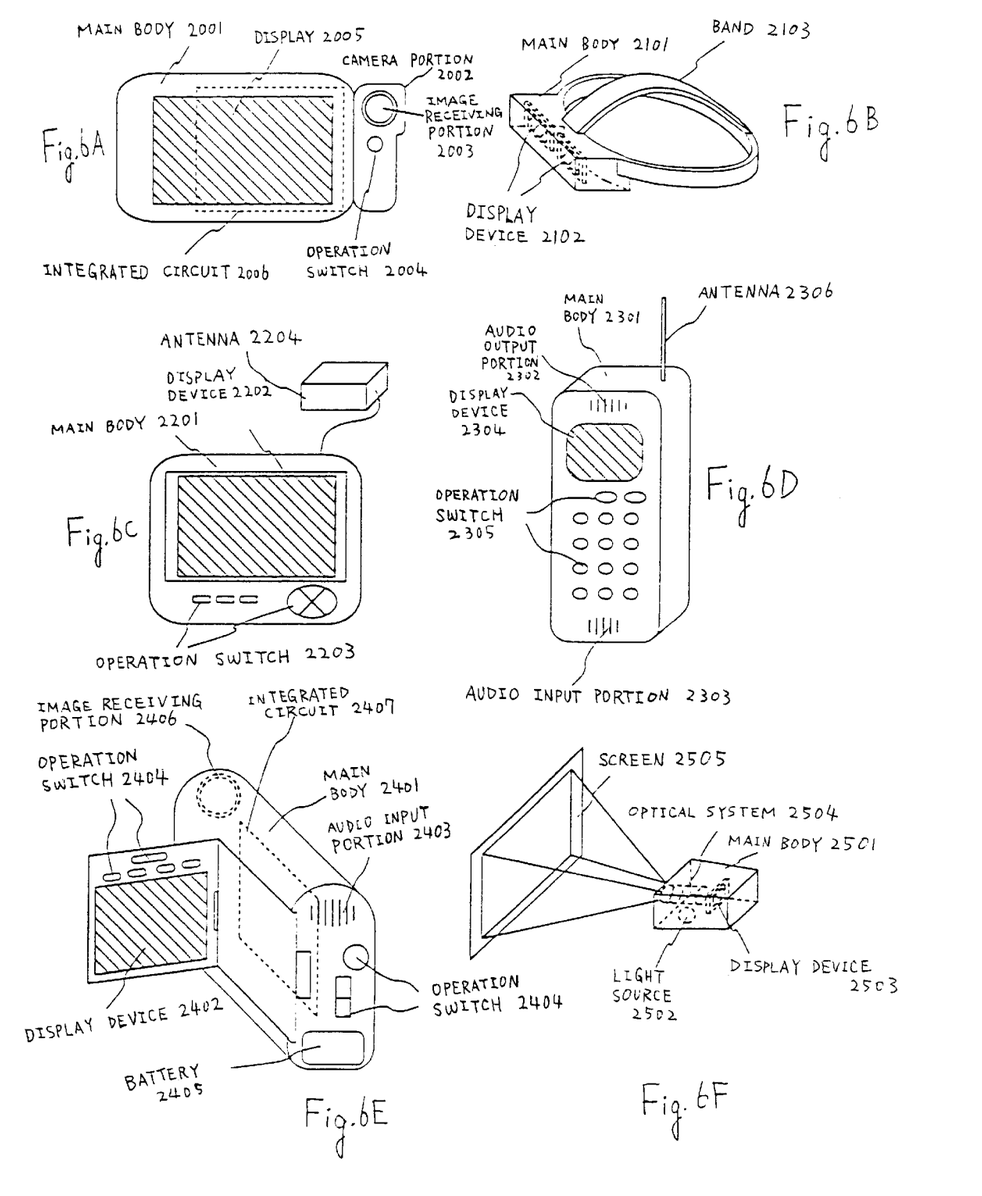
FIGS. 6A to 6F are views schematically showing apparatuses using the present invention.

FIG. 6A shows a portable information processing terminal, which has a communication function using telephone lines.

Figure 7:
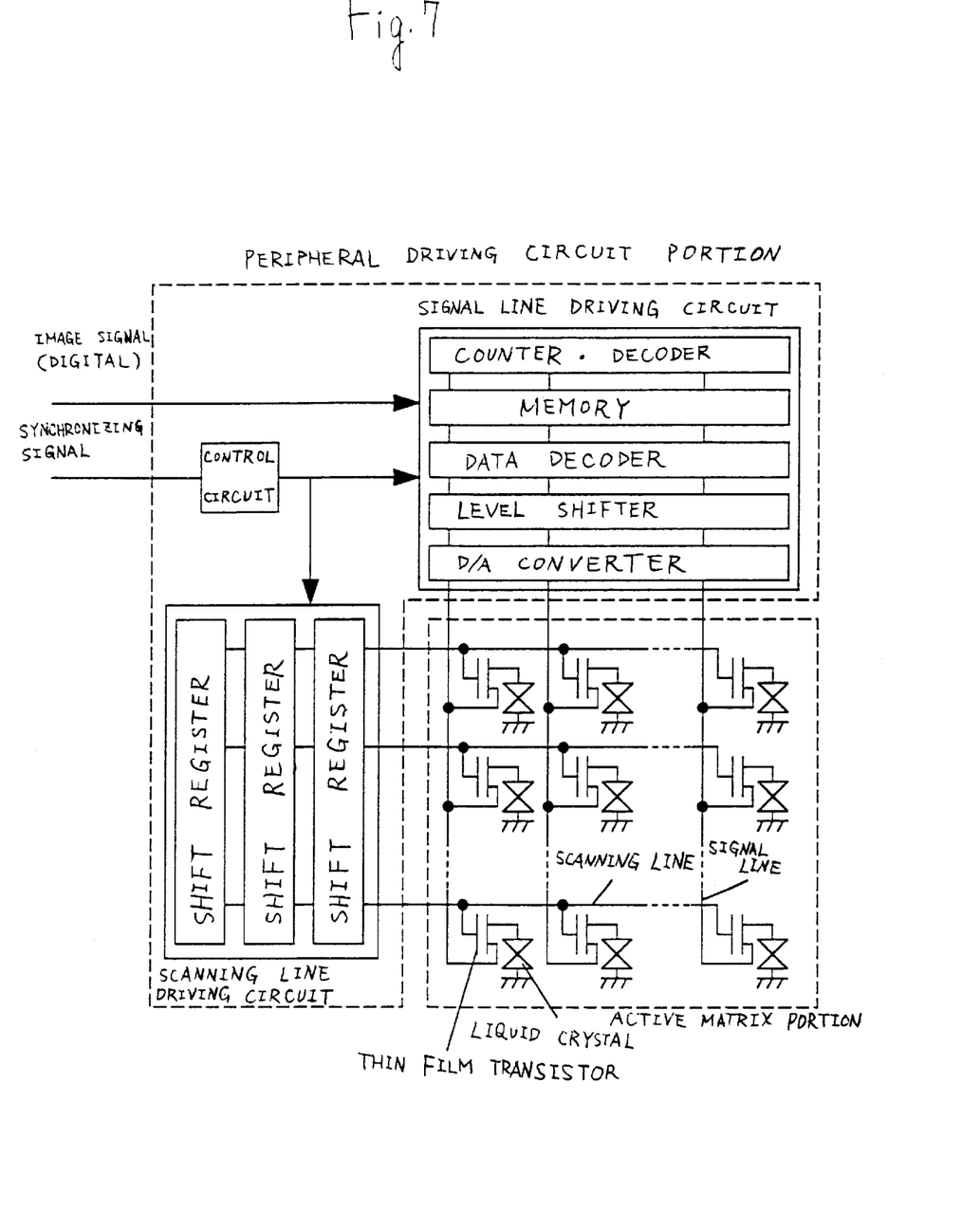
FIG. 7 is a block diagram showing a schematic structure of a liquid crystal apparatus.

This electronic device includes an integrated circuit 2006 using thin film transistors in the inside of a main body 2001. The device further includes an active matrix type liquid crystal display 2005, a camera portion 2002 for taking in an image, and an operation switch 2004. FIG. 7 is a block diagram for showing the outline of the active matrix type liquid crystal display device. The respective circuit blocks shown in FIG. 7 are constituted by a thin film transistor or a CMOS element constituted by thin film transistors, as a basic element.

FIG. 6B shows an electronic device called a head mount display. This device has a function to display an apparent image in front of eyes by mounting a main body 2101 on a head by a band 2103. The image is formed by liquid crystal display devices 2102 corresponding to right and left eyes.

A circuit using thin film transistors is used for such an electronic device to make the device compact and light.

FIG. 6C shows a device having a function to display map information and various kinds of information based on a signal from a satellite. The information received by an antenna 2204 is processed by an electronic circuit provided inside of a main body 2201 and necessary information is displayed on a liquid crystal display device 2202.

The device is operated by an operation switch 2203. A circuit using thin film transistors is used even in such a device to make the entire structure compact. FIG. 6D shows a portable telephone. This electronic device is made of a main body 2301 provided with an antenna 2306, an audio output portion 2302, a liquid crystal display device 2304, an operation switch 2305, and an audio input portion 2303.

FIG. 6E shows a portable imaging device called a video camera. This electronic device is made of a main body 2401 provided with a liquid crystal display device 2402 attached to a close-open member, and an operation switch 2404 attached to the close-open member.

Further, the main body 2401 is provided with an image receiving portion 2406, an integrated circuit 2407, an audio input portion 2403, an operation switch 2404, and a battery 2405.

FIG. 6F shows an electronic device of a projection type liquid crystal display device. This device is made of a main body 2501 provided with a light source 2502, a liquid crystal display device 2503, and an optical system 2504, and has a function to project an image on a screen 2505.

As the liquid crystal display device in the above described electronic device, both a transmission type and a reflection type may be used. The transmission type is advantageous in the display property, and the reflection type is advantageous in the case where low consumption of electric power or a compact and light device is sought.

Further, as the display device, a flat panel display such as a plasma display or an active matrix type EL display can be used.

Embodiment 6

In this embodiment, an example of forming a CMOS element which is complementarily constituted by a P-channel TFT (PTFT) and an N-channel TFT (NTFT), will be described.

A general circuit is constituted by a CMOS circuit in which a PTFT and a NTFT are complementarily constituted, as a basic element.

In this embodiment, an example of using a technique for crystallizing an entire surface by introducing nickel in the entire surface, will be described.

Figure 8A:
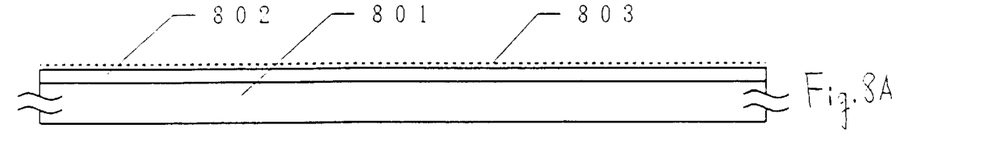
FIGS. 8A to 8F are views showing manufacturing steps of TFTs constituting a CMOS.

FIGS. 8A to 8F show manufacturing steps. First, an amorphous silicon film 802 is formed on a glass substrate 801. Next, by using a solution, a nickel element is held as indicated by reference numeral 803, while being brought into contact with the surface of the amorphous silicon film 802 (FIG. 8A).

Figure 8B:
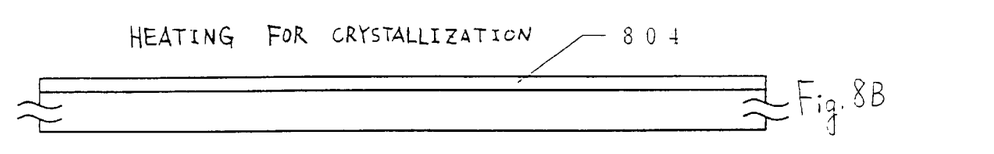

Next, heating for crystallization is carried out to form a crystalline silicon film 804 (FIG. 8B).

Figure 8C:
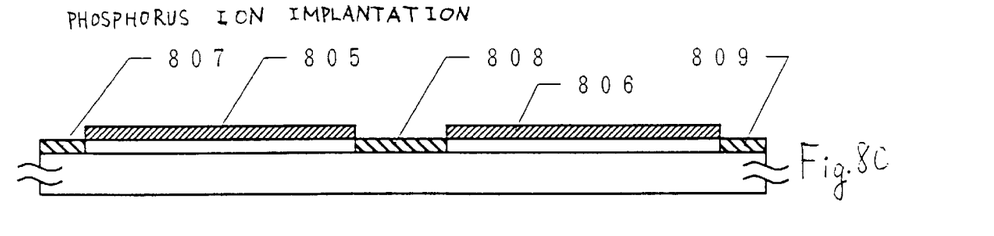

Further, masks 805 and 806 are disposed and a phosphorus ion is implanted. In this way, regions 807, 808 and 809 are doped with the phosphorus ion (FIG. 8C).

Figure 8D:
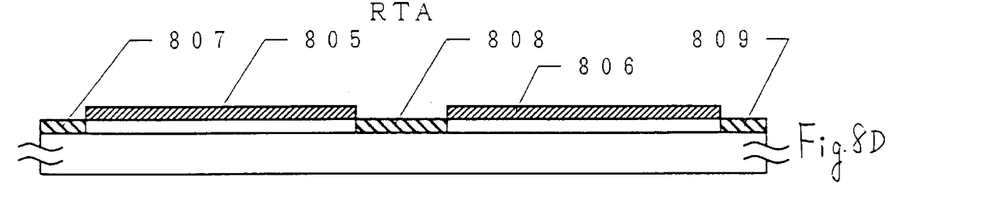

Next, the RTA is carried out so that the nickel element is gettered in the regions 807, 808 and 809 (FIG. 8D).

Figure 8E:
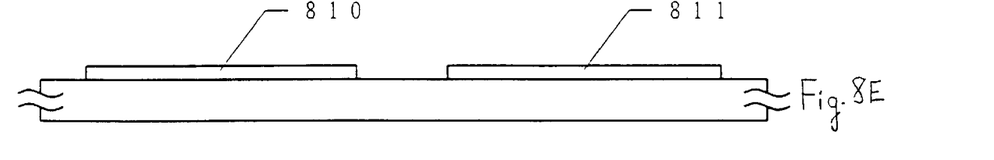

Next, the masks 805 and 806 are removed. In this way, regions 810 and 811 of the crystalline silicon film in which the nickel element is gettered to the outside, are obtained. Here, the region 810 becomes an active layer of the PTFT. The region 811 becomes an active layer of the NTFT (FIG. 8E).

Figure 8F:
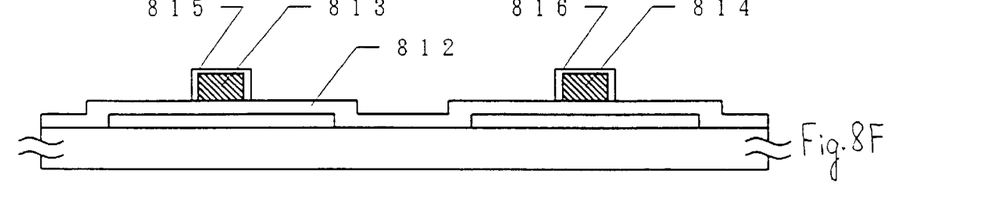

Next, a gate insulating film 812 is formed, and further gate electrodes 813 and 814 of aluminum are formed. Anodic oxidation films 815 and 816 are formed on the surroundings of the gate electrodes (FIG. 8F).

Figure 9A:
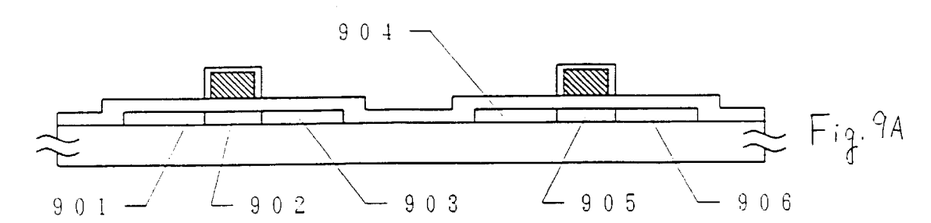
FIGS. 9A to 9C are views showing manufacturing steps of TFTs constituting a CMOS.

Next, doping of phosphorus is carried out by a plasma doping method so that doping of phosphorus is carried out in regions 901, 903, 904 and 906 (FIG. 9A).

Regions 902 and 905 in which doping was not carried out in this step, subsequently becomes channel regions.

Figure 9B:
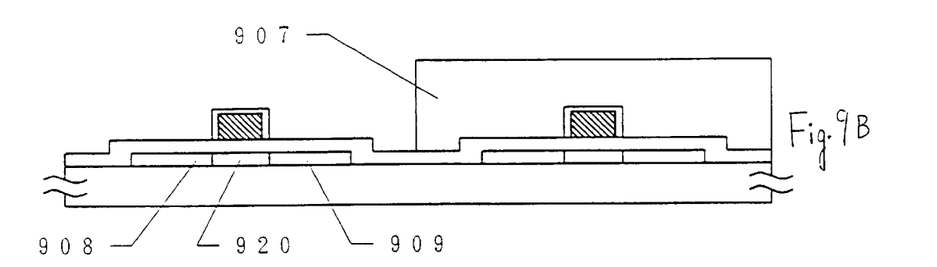

Next, a mask 907 is disposed and doping of boron is carried out. In this step, regions 908 and 909 are inverted from an N-type to a P-type.

In this way, it is possible to form the PTFT at the left side and at the same time, to form the NTFT at the right side (FIG. 9B).

Figure 9C:
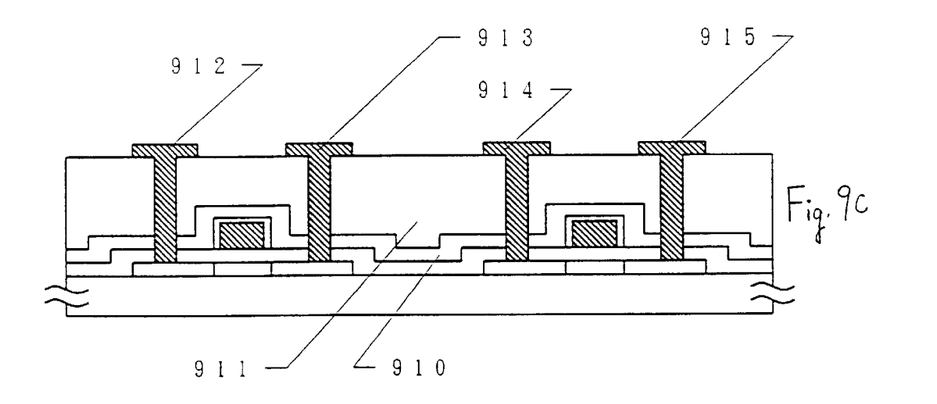

Next, a silicon nitride film 910 as an interlayer insulating film is formed, and a polyimide resin film 911 is further formed.

Further, contact holes are formed to form a source electrode 912 and a drain electrode 913 of the PTFT, and a source electrode 915 and a drain electrode 914 of the NTFT. In this way, the structure shown in FIG. 9C is obtained.

Here, if the gate electrodes of both the TFTs are connected to each other, and further the drain electrodes are connected to each other, the CMOS structure can be obtained.

Embodiment 7

This embodiment is an example in which a vapor phase method is used as a method of introducing phosphorus for gettering into a region.

In this embodiment, an example in which nickel is used as a metal element for promoting crystallization, and phosphorus is used as an element in group 15, will be described.

In this embodiment, by a CVD method using a $PH_3$ gas, a film containing phosphorus (P) is deposited on the surface of a region where nickel is to be gettered (for example, a region indicted by reference numeral 18 in FIG. 1). The RTA is carried out to move the nickel element to the region 18 to carry out gettering.

In this case, the gettering effect of a damaged region formed in the case where the phosphorus ion is accelerated and implanted, can not be obtained. However, since the gettering effect of phosphorus to nickel is extremely high, it is possible to carry out gettering of nickel as shown in FIG. 1.

Embodiment 8

This embodiment is an example in which a liquid phase method is used as a method for introducing phosphorus for gettering into a region.

In this embodiment, PSG (Phosphorus Silicate Glass) is formed in a region where a metal element is to be gettered.

For example, in the step shown in FIG. 1D, a PSG film is formed on the region 18, and then the RTA process is applied, so that the nickel element can be concentrated into the region 18. That is, it is possible to getter the nickel element to transform the region 19 to the region 20.

As described above, according to the present invention, a metal element can be effectively removed from a silicon film obtained by crystallizing an amorphous silicon film by using the metal element for promoting crystallization of the amorphous silicon film. As a result, a large number of electronic devices which use crystalline silicon films and have high reliability, can be provided. Thus, the present invention is useful in industry.

What is claimed is:

1. A method of manufacturing a semiconductor device, comprising the steps of:

selectively masking a part of a crystalline silicon film or a crystalline film containing silicon, which has been obtained by using a metal element for promoting crystallization of silicon;

accelerating and implanting an element in group 15 into a region which has not been masked in the masking step; and radiating intense light to heat a masked region of the film at a temperature higher than other portions to move the metal element from the masked region of the film to the other portions, wherein a material used in the masking step has a property to absorb the intense light at absorptivity higher than the crystalline silicon film or the crystalline film containing silicon.

2. A method of manufacturing a semiconductor device, comprising the steps of:

selectively masking a part of a crystalline silicon film or a crystalline film containing silicon, which has been obtained by using a metal element for promoting crystallization of silicon;

accelerating and implanting an element in group 15 into a region which has not been masked in the masking step; and radiating intense light to heat a masked region of the film at a temperature higher than other portions, wherein a material used in the masking step has a property to absorb the intense light at absorptivity higher than the crystalline silicon film or the crystalline film containing silicon.

3. A method according to claim 1 or 2, wherein the mask includes a kind or plural kinds of element selected from a group consisting of tungsten, chromium, molybdenum, and titanium.

4. A method according to claim 1 or 2, wherein the metal element is a kind or plural kinds of element selected from a group consisting of Fe, Co, Ni, Ru, Rh, Pd, Os, Ir, Pt, Cu, and Au.

5. A method according to claim 1 or 2, wherein the metal element is nickel.

6. A method according to claim 1 or 2, wherein an element selected from the group consisting of N, P, As, Sb, and Bi is used as the element in group 15.

7. A method according to claim 1, wherein said semiconductor device is an EL display device.

8. A method according to claim 1, wherein said device is one of a video camera, head mount display, car navigation system, portable telephone and projector.

9. A method according to claim 2, wherein said semiconductor device is an EL display device.

10. A method according to claim 2, wherein said device is one of a video camera, head mount display, car navigation system, portable telephone and projector.

11. A method of manufacturing a semiconductor device, comprising:

a first step of obtaining a crystalline film by crystallizing an amorphous film containing silicon by using a metal element for promoting crystallization of silicon;

a second step of selectively forming a mask including a material, which has absorptivity to light to be radiated in a subsequent fourth step and has heat resistance, on the crystalline film obtained in the first step;

a third step of accelerating and implanting an element in group 15 into the crystalline film by using the mask; and a fourth step of radiating intense light to the crystalline film and the mask to carry out a rapid thermal annealing process, wherein a material used in the masking step has a property to absorb the intense light at absorptivity higher than the crystalline silicon film or the crystalline film containing silicon.

12. A method according to claim 11, wherein the metal element is a kind or plural kinds of element selected from the group consisting of Fe, Co, Ni, Ru, Rh, Pd, Os, Ir, Pt, Cu, and Au.

13. A method according to claim 11, wherein the metal element is nickel.

14. A method according to claim 11, wherein an element selected from the group consisting of N, P, As, Sb, and Bi is used as the element in group 15.

15. A method according to claim 11, wherein radiation of the intense light in the fourth step is carried out from a substrate side.

16. A method according to claim 11, wherein the mask includes a kind or plural kinds of element selected from a group consisting of tungsten, chromium, molybdenum, and titanium.

17. A method according to claim 11, wherein said device is one of a video camera, head mount display, car navigation system, portable telephone and projector.

18. A method according to claim 11, wherein said semiconductor device is an EL display device.

19. A method of manufacturing a semiconductor device, comprising the steps of:

selectively masking a part of a crystalline silicon film or a crystalline film containing silicon, which has been obtained by using a metal element for promoting crystallization of silicon;

accelerating and implanting an element in group 15 into a region which has not been masked in the masking step; and radiating intense light to heat a masked region of the film at a temperature higher than other portions to move the metal element from the masked region of the film to the other portions, wherein a material used in the masking step includes a kind or plural kinds of element selected from the group consisting of tungsten, chromium, molybdenum, and titanium.

20. A method according to claim 19, wherein the metal element is a kind or plural kinds of element selected from the group consisting of Fe, Co, Ni, Ru, Rh, Pd, Os, Ir, Pt, Cu, and Au.

21. A method according to claim 19, wherein an element selected from the group consisting of N, P, As, Sb, and Bi is used as the element in group 15.

22. A method according to claim 19, wherein a mask in the masking step has a thickness of 1000 Å or more.

23. A method according to claim 19, further comprising a step of removing said region which has not been masked in the masking step.

24. A method according to claim 19, wherein said semiconductor device is an EL display device.

25. A method according to claim 19, wherein said semiconductor device is one of a video camera, head mount display, car navigation system, portable telephone and projector.

26. A method of manufacturing a semiconductor device comprising the steps of:

forming a semiconductor film comprising silicon on an insulating surface;

providing said semiconductor film with a crystallization promoting material wherein said crystallization promoting material contains a metal;

crystallizing said semiconductor film by using crystallization promoting material;

forming a mask over a first portion of the crystallized semiconductor film;

selectively introducing an element selected from group 15 elements into a second portion of the crystallized semiconductor film, wherein said second portion is not covered by said mask; and heating the crystallized semiconductor film after the introduction of said element in order that the metal contained in said first portion is absorbed by said second portion, wherein a temperature of said first portion covered by said mask is higher than said second portion.

27. The method according to claim 26, wherein said mask comprises a material selected from the group consisting of tungsten, chromium, molybdenum, and titanium.

28. The method according to claim 26, wherein said crystallization promoting material contains a metal selected from the group consisting of Fe, Co, Ni, Ru, Rh, Pd, Os, Ir, Pt, Cu, and Au.

29. The method according to claim 26, wherein said heating of the crystallized semiconductor film is conducted by a rapid thermal annealing.

30. A method according to claim 26, wherein said mask has a thickness of 1000 Å or more.

31. A method according to claim 26, further comprising a step of removing said element selected from group 15 after heating the crystallized semiconductor film.

32. A method according to claim 26, wherein said semiconductor device is an EL display device.

33. A method according to claim 29, wherein said semiconductor device is one of a video camera, head mount display, car navigation system, portable telephone and projector.

34. A method of manufacturing a semiconductor device, comprising the steps of:

selectively masking a part of a crystalline silicon film or a crystalline film containing silicon, which has been obtained by using a metal element for promoting crystallization of silicon;

forming a phosphorus silicate glass in a region which has not been masked in the masking step; and radiating intense light to heat a masked region of the film at a temperature higher than other portions to move the metal element from the masked region of the film to the other portions, wherein a material used in the masking step has a property to absorb the intense light at absorptivity higher than the crystalline silicon film or the crystalline film containing silicon.

35. A method according to claim 34, wherein the metal element is a kind or plural kinds of element selected from the group consisting of Fe, Co, Ni, Ru, Rh, Pd, Os, Ir, Pt, Cu, and Au.

36. A method according to claim 34, wherein an element selected from the group consisting of N, P, As, Sb, and Bi is used as the element in group 15.

37. A method according to claim 34, wherein a mask in the masking step has a thickness of 1000 Å or more.

38. A method according to claim 34, further comprising a step of removing said region which has not been masked in the masking step.

39. A method according to claim 34, wherein said semiconductor device is an EL display device.

40. A method according to claim 34, wherein said semiconductor device is one of a video camera, head mount display, car navigation system, portable telephone and projector.

* * * * *